United States Patent

Umeda

[15] 3,636,416

[45] Jan. 18, 1972

[54] LIGHT-EMITTING DIODE WITH SUBNANOSECOND RESPONSE TIME

[72] Inventor: Junichi Umeda, Kodaira, Japan

[73] Assignee: Hitachi, Ltd., Tokyo, Japan

[22] Filed: Sept. 8, 1970

[21] Appl. No.: 70,120

[30] Foreign Application Priority Data

Sept. 10, 1969 Japan....................................44/71245

[52] U.S. Cl....................317/234 R, 313/108 D, 317/234 Q, 317/235 L, 317/235 N, 317/235 AC, 317/235 AN, 317/235 AP

[51] Int. Cl........................H01l 3/20, H01l 5/00, H01l 9/00, H01l 11/12, H05b 33/00

[58] Field of Search.............317/235 AN, 235 N; 313/108 D

[56] References Cited

UNITED STATES PATENTS

| | | | |
|---|---|---|---|
| 3,132,057 | 5/1964 | Greenberg | 148/33 |
| 3,333,135 | 7/1967 | Galginaitis | 313/108 D |
| 3,351,827 | 11/1967 | Newman | 317/235 |
| 3,398,310 | 8/1968 | Larsen et al. | 313/108 D |
| 3,419,742 | 12/1968 | Herzog | 313/108 D |
| 3,436,625 | 4/1969 | Newman | 317/237 |
| 3,456,209 | 7/1969 | Diemer | 331/94.5 |
| 3,458,782 | 7/1969 | Buck et al. | 317/235 |
| 3,501,679 | 3/1970 | Yonezu et al. | 317/234 |
| 3,537,029 | 10/1970 | Kressel et al. | 317/234 X |
| 3,560,275 | 2/1971 | Kressel et al. | 148/175 |

OTHER PUBLICATIONS

Foster et al., " Electroluminescence Near Band Gap in Gallium Phosphide...," Applied Physics Letters Vol. 7, No. 3, Aug. 1965, pp. 65- 67.

Imenkov et al., " Electroluminescence Spectra of...Degenerate Gallium Arsenide," Soviet Physics-Solid State, Vol. 7, No. 3, pp. 618- 622 (Sept. 65), a translation of Fizika Tverdogo Tela, Vol. 7 No. 3, pp. 775- 780 (Mar. 65).

Sarace et al., "Injection Luminescence in GaAs by Direct... Re combination," Physical Review Vol. 137, No. 2A, Jan. 1965, pp. 623-626.

Casey et al., " Width of the Spontaneous Emission Region in Degenerate GaAs...," Journal of Applied Physics Vol. 37, No. 2, Feb. 66, pp. 893- 898.

Leite et al., " Injection Mechanisms in GaAs...," Physical Review Vol. 137, No. 5A, Mar. 1965, pp. 1583- 1590.

*Primary Examiner*—John W. Huckert

*Assistant Examiner*—William D. Larkin

*Attorney*—Craig, Antonelli & Hill

[57] ABSTRACT

An ultrarapid luminescent semiconductor device capable of emitting light having a short response time comprising a semiconductor mixed crystal having a direct band-gap structure and a PN-junction formed therein. The composition of the part of the crystal through which light emitted by the PN-junction is transmitted is such that the component which makes the forbidden band of the semiconductor crystal narrow is increased in its proportion gradually or stepwise in the direction of light transmission so that light emitted due to the diagonal tunnelling effect can be transmitted, but light emitted by the transition between donors and acceptors is absorbed.

3 Claims, 6 Drawing Figures

INVENTOR

JUNICHI UMEDA

BY Craig, Antonelli, Stewart & Hill

ATTORNEYS

INVENTOR

JUNICHI UMEDA

BY Craig, Antonelli, Stewart & Hill

ATTORNEYS

LIGHT-EMITTING DIODE WITH SUBNANOSECOND RESPONSE TIME

BACKGROUND OF THE INVENTION

1. Field of the Invention

The present invention relates to an injection electroluminescent mixed crystal semiconductor device having a short response time capable of being used for an input and output device employing light for electronic computers or the like.

2. Description of the Prior Art

In the field of electro-optics a quick response of the light emission to an electric signal and a low-voltage operation which enables a direct drive by a solid-state circuit, i.e., a logic circuit are required for electro-optical transducers. As one which meets these requirements an electroluminescent diode employing the phenomenon of injection luminescence is being developed.

As the electroluminescent diodes PN-junction structures employing GaAs, GaP, GaAs-GaP mixed crystals, GaAs-AlAs mixed crystals, SiC, etc., as their materials are known. All of these utilize emitted light due to the recombination of minority carriers injected through the PN-junction by applying thereto a forward bias voltage nearly equal to or higher than the built-in voltage. This recombination almost always occurs through the intermediary of the impurity level, and hence the emission wavelength is nearly independent of the bias voltage and substantially corresponds to the energy difference between donors and acceptors.

The response of the luminescence to an electric signal is determined at its rise by the time during which injected carriers are captured by the impurity level and fill up the level, and at its fall by the time during which all of the electrons in the impurity level are exhausted by recombination. The response time of the electroluminescent diode with the so-called indirect band-gap structure such as GaP and SiC is of the order of $10^{-7}$ sec. or more, and that of the electroluminescent diode with the so-called direct band-gap structure such as GaAs, GaAs-GaP mixed crystals and GaAs-AlAs mixed crystals is of the order of from $10^{-8}$ to $10^{-9}$ sec. These response times are far shorter than those at present in practically used electro-optical transducers such as incandescent lamps (of the order of $10^{-3}$ sec.), discharge tubes (of the order of $10^{-8}$ sec. or more) and phosphor (of the order of $10^{-6}$ sec. or more), but cannot be compared, in principle, with the tunnel diode (of the order of $10^{-10}$ sec. or less) employed in the electric signal arrangement so far as the above-mentioned phenomenon is employed.

The phenomenon called "diagonal tunnelling" was reported in the article entitled "Injection Mechanisms in GaAs Diffused Electroluminescent Junctions" in the Physical Review, Vol. 137A, 1965, pages 1583–1590. This phenomenon is such that electrons in the N-type layer diagonally transverse the depletion layer due to the tunnel effect and combine with positive holes in the P-type layer to emit light, and this is a very rapid phenomenon. However, such an electroluminescent semiconductor device as is capable of effectively emitting only this light has not been known.

SUMMARY OF THE INVENTION

An object of the present invention is to provide an ultrarapid electroluminescent semiconductor device with a luminescence response time of the order of $10^{-9}$ sec. or less and capable of effectively emitting only light produced by the diagonal tunnelling.

The electroluminescent semiconductor device according to the present invention must satisfy the following three conditions:

1. A semiconductor having a direct band-gap structure is provided with a PN-junction at least one side of which includes a degenerate or nearly degenerate layer.
2. The electroluminescent diode is allowed to luminescence by applying a forward bias voltage $V_f$ lower than the following voltage $V_o$ proper to the diode $$V_o = V_B - \zeta/e - \epsilon/e \qquad (1)$$

where $V_B$: Built-in voltage, $\zeta$: Fermi level of the N-type (or P-type layer relative to the edge of the conduction (or valence) band, $\epsilon$: Energy of the band tail edge consisting of the donor (or acceptor) level relative to the conduction (or valence) band, $e$: Absolute value of the electronic charge.

3. The diode has a cutoff filtering function to absorb light of wavelengths shorter than $\lambda_c$ which is determined by:

$$eV_f \leq hc/\lambda_c \leq eV_o \qquad (2)$$

where $h$ is Planck's constant and $c$ is the velocity of light.

Now, the principle on which the device according to the present invention provides ultrarapid luminescence in response to an electric signal will be described.

Even if the forward bias voltage $V_f$ satisfying equation (2) is applied to the diode, a majority of electrons in the conduction band of the N-type layer are not injected into the P-type layer because the bias voltage $V_f$ is lower than the voltage $V_o$. Thus, luminescence through the intermediary of the impurity level hardly occurs.

However, since the wave function of electrons in the conduction band of the N-type layer and the wave function of positive holes in the valence band of the P-type layer partly overlap each other due to the tunnel effect, the recombination emission of light at the overlapped portion is possible, and the emission of light having wavelengths of approximately $h\nu_f = hc/\lambda_f \fallingdotseq eV_f$ occurs. At the same time, the so-called phonton assisted tunnelling current flows. The so-called tunnelling assisted light emission according to this mechanism is based on the tunnel effect. This mechanism is quite different from the aforementioned mechanism in which the time during which injected electrons are captured in and fill up the impurity level and the time during which, after the removal of the applied voltage, the electrons remaining in the impurity level are exhausted by recombination determine the rise and fall times of the luminescence, and an independent on these times.

What effectively determines the response time of the tunnelling assisted light emission is the capacity C of the PN-junction of this diode and the equivalent series resistance R. These factors are the vary factors which determine the response time of the tunnel diode. Consequently, the response time $\tau$ of the luminescence is $\tau = RC$, and is expected to be of the order of $10^{-10}$ sec. or less which is the same order as the response time of the tunnel diode.

The foregoing and other objects features and advantages of the present invention will become more apparent from the following detailed description of the preferred embodiments of the present invention made with reference to the accompanying drawings.

DESCRIPTION OF THE PREFERRED EMBODIMENTS

Figure 1:
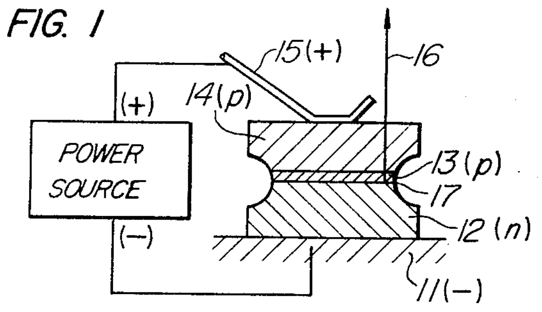
FIG. 1 is a schematic cross-sectional view of a tunnelling assisted luminescent diode according to the present invention.

Referring now to FIG. 1 which illustrates in cross section a GaAsP tunnelling assisted luminescent diode according to the present invention, the diode on a negative electrode 11 comprises an N-type layer 12 of $GaAs_{0.6}P_{0.4}$, a P-type layer 13 of $GaAs_{0.6}P_{0.4}$ and a P-type layer 14 of GaAsP in which the mixture ratio of P to As gradually decreases from $GaAs_{0.6}P_{0.4}$ at the interface with the P-type layer 13 to $GaAs_{0.7}P_{0.3}$ at the opposite surface, and is provided with a positive electrode 15 on the P-type layer 14. The junction plane 17 of the N-type layer 12 and the P-type layer 13 emits light 16 due to tunnel luminescence. The thicknesses of the layers 12, 13 and 14 are 100 microns, 1 micron and 4 microns, respectively, and the area of the junction plane 17 is 0.25 mm.$^2$.

Figure 3:
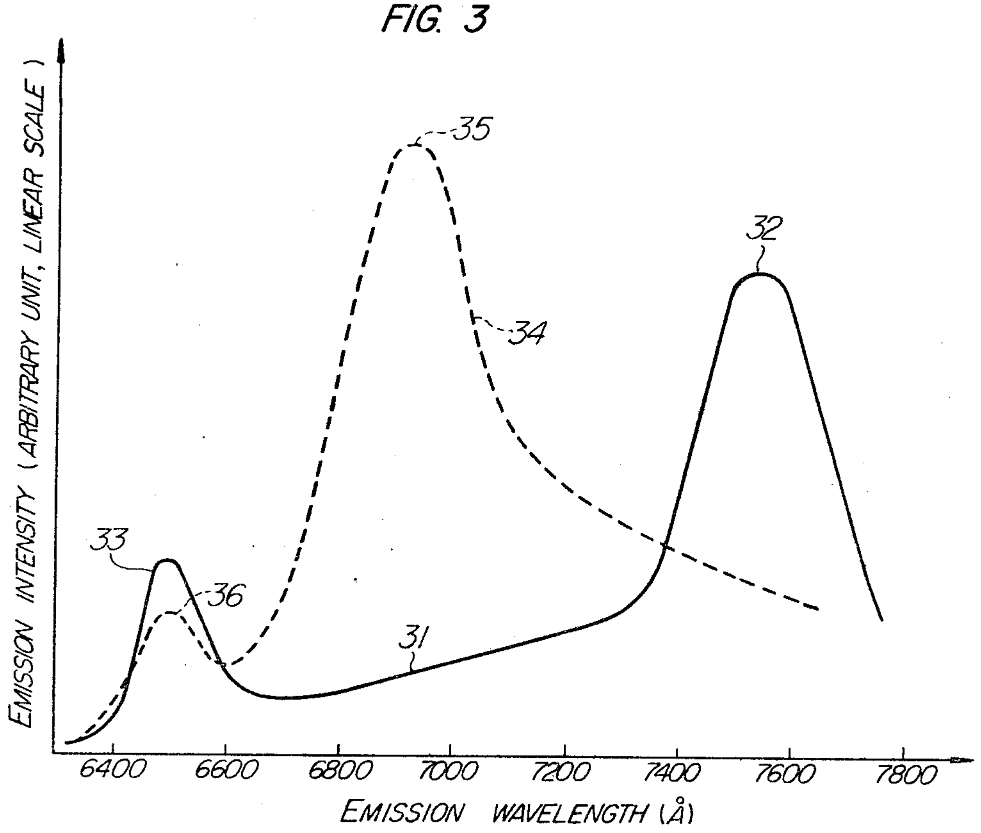
FIG. 3 is a graph showing the spectra of the light emitted from the tunnelling assisted luminescent diodes of FIGS. 1 and 2.

The luminescent diode shown in FIG. 1 is fabricated by employing an N-type GaAsP crystal manufactured by vapor growth on a GaAs substrate by varying the ratio of the partial pressures of $AsCl_3$ and $PCl_3$. The vapor growth layer is an N-type layer doped with Te as a donor to a concentration of $2.67\times10^{17}$ cm.$^{-3}$. The PN-junction is formed by diffusing Zn into the N-type GaAsP crystal in a P and As atmosphere at 850° C. for 60 min. Emission spectra of the luminescence of this luminescent diode as measured in a parallel direction to the junction plane are shown in FIG. 3. The spectrum represented by a solid line 31 is one obtained at a temperature of 77° K. with a voltage of 1.772 volt applied in the forward direction. The current which flowed at that time was 2.0 ma. The peak 32 results from the tunnelling assisted light emission, and the peak 33 is due to the light emission via the impurity level which is the same mechanism as in the ordinary luminescent diode. The spectrum represented by the dotted line 34 is one obtained at a temperature of 77° K. with a forward voltage of 1.810 volt which induced a current of 5.0 ma. The peak 35 is due to the tunnelling assisted light emission, and the peak 36 is due to the same mechanism as in the ordinary luminescent diode. The response time of the short wavelength side luminescence in the vicinity of 6,500 A is about $5\times10^{-9}$ sec. When this emitted light is directed to the outer surface of the layer 14, a substantial proportion of the light is absorbed by the surface layer consisting of $GaAs_{0.7}P_{0.3}$ and only a negligible amount of the light is emitted outwards through the surface layer. The long wavelength side light emission is the light emission due to the photon assisted tunnelling. Since this light is long in its wavelength, it is transmitted through the $GaAs_{0.7}P_{0.3}$ surface layer and emitted outwards.

The junction capacity C of this diode is 774 pf., the equivalent series resistance $R$ thereof is about 1 ohm, and the response time $\tau$ is about $0.8\times10^{-9}$ sec. at a forward bias voltage of 1.722 volt. Since the equivalent series resistance $R$ might possibly be reduced to 0.1 ohm, it is expected that the response time can further be reduced by one order of magnitude.

Figure 4:
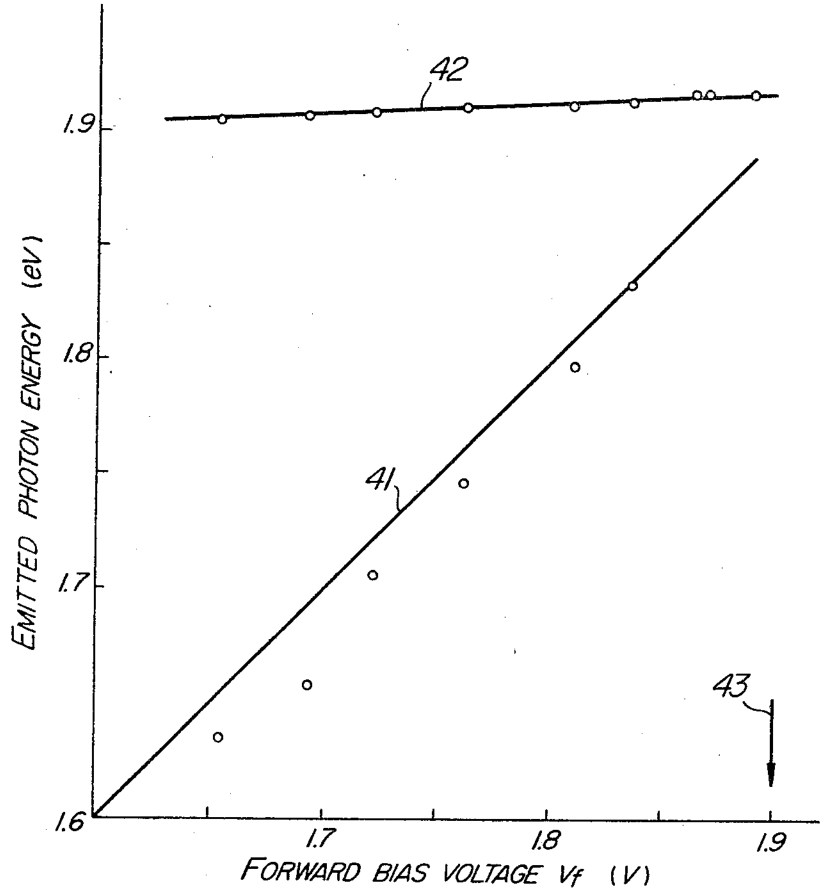
FIG. 4 is a graph showing the bias voltage versus photon energy characteristics of the light emitted from the tunnelling assisted luminescent diodes of FIGS. 1 and 2.

FIG. 4 shows the relationships between the emitted photon energy and the forward bias voltage for tunnelling assisted light emission and for interdonor and acceptor transition light emission. White dots are measured points at 77° K. The straight line 41 represents the energy of photons produced when electrons perform transition by the potential difference corresponding to the forward bias voltage $V_f$. The measured points slightly below the straight line 41 represent the energies at the peaks of the tunnelling assisted light emission. The straight line 42 is a line connecting measured points of the energy of photons emitted by the interdonor and acceptor transition. As stated earlier, the emitted photon energy is mainly determined by the width of the forbidden band and barely depends on the forward bias voltage. The arrow 43 indicates the position of the voltage $V_o$.

In this embodiment the mixture ratio of P to As in the P-type layer 14 decreases gradually from $GaAs_{0.6}P_{0.4}$ to $GaAs_{0.7}P_{0.3}$the mixture ratio in a stepwise manner.

Figure 2:
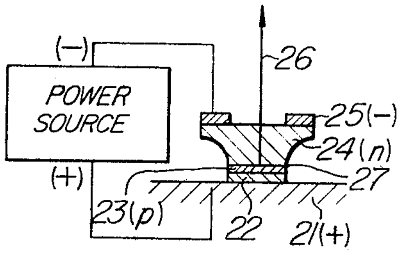
FIG. 2 is a schematic cross-sectional view of another tunnelling assisted luminescent diode according to the present invention.
Figure 5:
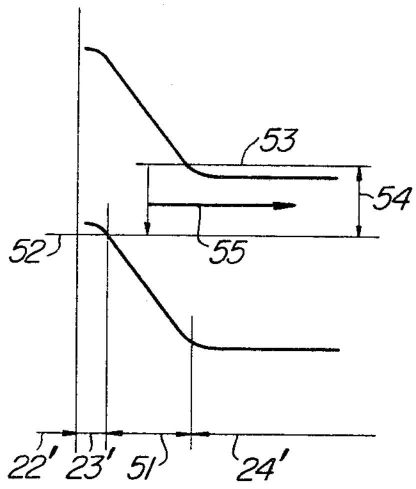
FIG. 5 is an energy state diagram in the vicinity of the PN-junction of the tunnelling assisted luminescent diode of FIG. 2.

Fig. 2 shows in cross section the structure of an alloy-type luminescent diode having a shallow P-type layer. The luminescent diode provided on a positive electrode 21 comprises an alloyed electrode 22, a P-type layer 23 of $GaAs_{0.6}P_{0.4}$ disposed on the alloyed electrode 22, an N-type layer 24 of GaAsP provided on the P-type layer 23 in which the mixture ratio of P to As gradually decreases from $GaAs_{0.6}P_{0.4}$ at the junction 27 with the P-type layer 23 to $GaAs_{0.7}P_{0.3}$ at the opposite surface, and an annular negative electrode 25 formed on the N-type layer 24. The PN-junction 27 emits light 26 by the tunnelling assisted light generation. FIG. 5 shows an energy diagram at and around the junction of the luminescent diode of FIG. 2. The regions 22′, 23′ and 24′ correspond to the layers 22, 23 and 24, respectively, in FIG. 2, and the region 51 represents the depletion layer. The straight lines 52 and 53 represent the Fermi levels of the alloyed layer 22 and the N-type layer 24, respectively, the gap 54 represents the forward bias voltage, and the arrow 55 represents light emitted through the N-type layer 24 due to the tunnelling assisted emission.

The tunnelling assisted luminescent diode of FIG. 2 is manufactured by employing the same kind of crystal as is utilized for the luminescent diode of FIG. 1. Consequently, the spectra of light emitted by this diode and the relation between the emitted photon energy and the forward bias voltage are similar to those shown in FIGS. 3 and 4, respectively. However, since the diode of FIG. 2 employs a wide annular electrode 25 instead of the thin electrode 15 for the diode of FIG. 1, and since the P-type layer 23 is a very shallow recrystallized layer, the equivalent series resistance $R$ of the diode of FIG. 2 is smaller than that of diode of FIG. 1 by one order of magnitude or more.

Figure 6:
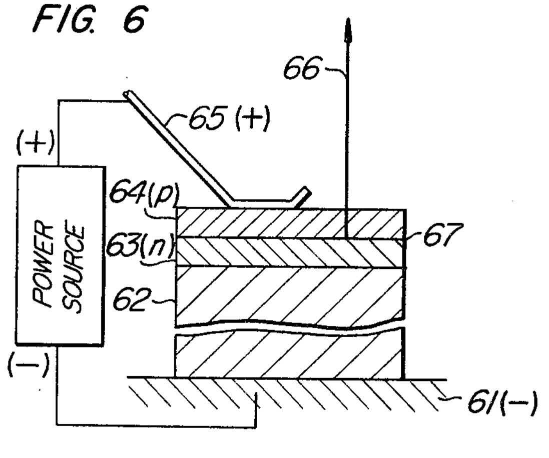
FIG. 6 is a schematic cross-sectional view of a further tunnelling assisted luminescent diode according to the present invention.

FIG. 6 shows in cross section the structure of a GaAlAs tunnelling assisted luminescent diode according to the present invention. This diode comprises a GaAs substrate 62 placed on a negative electrode 61, an N-type layer 63 of GaAlAs having an impurity concentration of $5\times10^{18}$ cm.$^{-3}$ in which the mixture ratio of Al to Ga increases from GaAs to $Ga_{0.6}Al_{0.4}As$ at the opposite surface, and P-type layer 64 of GaAlAs having an impurity concentration of $5\times10^{18}$ cm.$^{-3}$ and forming a PN-junction 67 with the N-type layer 63 in which the mixture ratio of Al to Ga gradually decreases from $Ga_{0.6}Al_{0.4}As$ at the PN-junction 67 to $Ga_{0.7}Al_{0.3}As$ at the opposite surface on which a positive electrode 65 is provided. The PN-junction 67 emits light 66 by the tunnelling assisted emission. The thicknesses of the layers 62, 63 and 64 are 200 microns, 10 microns and 10 to 20 microns, respectively.

The tunnelling assisted luminescent diode having the structure as shown in FIG. 6 can be manufactured, for example, by the following method. A GaAs substrate is immersed in a Ga solution saturated with GaAs to which is added Al in the proportion of $3\times10^{-3}$ by weight together with a slight amount of Te at 1,000° C., and then gradually cooled to about 880° C. during which Zn is added to the solution at 980° C.

The diode of FIG. 6 can emit rays of light having wavelengths of about 7,000 angstroms or more due to the tunnelling assisted emission.

For all of the above examples, when the composition of the bulk crystal at the PN-junction is expressed as $GaAs_{1-c}P_c$ and $Ga_{1-c}AlAs$, $c$ should be not smaller than 0.35 in order for the forbidden bandwidth to have a sufficient value to emit visible light, and yet should not be larger than 0.45 in order for the band structure to be of the direct band-gap type. On the other hand, since the wavelength of light emitted by the tunnelling assisted emission is substantially determined by the forward bias voltage, the forward bias voltage should be not lower than 1.6 volt in order for the emitted light to be visible light, and the upper limit of the forward bias should be not higher than 1.95 volt from equations (1) and (2).

I claim:

1. An injection electroluminescent semiconductor device in which light is emitted in a predetermined direction comprising:

a semiconducting mixed crystal having a direct band-gap structure;

a PN-junction formed in said crystal dividing said crystal into P- and N-type layers;

in at least one of said layers, the component of said crystal which makes the forbidden band of said crystal narrower being increased in its proportion in the direction along which light emitted by said PN-junction is directed, so that light generated by the transition of electrons due to the diagonal tunnelling effect between the conduction band in said N-type layer and the valence band in said P-type layer is not absorbed but light generated by the transition of electrons between donors and acceptors is absorbed by said crystal;

electrodes provided to said layers, respectively; and a source of voltage connected between said electrodes for applying a voltage to said PN-junction in the forward direction the voltage $V_f$ in the forward direction being smaller than $V_b-\zeta/e-\epsilon/e$ so that electrons can hardly be injected into said P-type layer, but said transition of electrons due to said diagonal tunnelling effect takes place sufficiently wherein $V_b$ is the built-in voltage of the PN-junction, $\zeta$ is the Fermi level of the N-type (or P-type layer relative to the edge of the conduction (or valence) band, $\epsilon$ is the energy of the band tail edge consisting of the donor (or acceptor) level relative to the conduction (or valence) band, and $e$ is the absolute value of the electron charge.

2. An injection electroluminescent semiconductor device according to claim 1, wherein the composition of said P- and N-type layers at said PN-junction is selected from the group consisting of $GaAs_{1-c}P_c$ and $Ga_{1-c}Al_cAs$ where $c$ is not less than 0.35 and not larger than 0.45.

3. An injection electroluminescent semiconductor device according to claim 2, wherein said applied voltage is higher than 1.6 v. and lower than 1.95 v.

* * * * *